(12) United States Patent
Huang et al.

(10) Patent No.: US 7,342,289 B2
(45) Date of Patent: Mar. 11, 2008

(54) STRAINED SILICON MOS DEVICES

(75) Inventors: Chien-Chao Huang, Hsin-Chin (TW);
Chung-Hu Ge, Taipei (TW);
Wen-Chin Lee, Hsinchu (TW);
Chenming Hu, Oakland, CA (US);
Carlos H. Diaz, Mountain View, CA (US);
Fu-Liang Yang, Hsin-chu (TW)

(73) Assignee: Taiwan Semiconductor Manufacturing Co., Ltd, Hsin-Chu (TW)

( * ) Notice: Subject to any disclaimer, the term of this patent is extended or adjusted under 35 U.S.C. 154(b) by 365 days.

(21) Appl. No.: 10/637,351

(22) Filed: Aug. 8, 2003

(65) Prior Publication Data

US 2005/0032321 A1  Feb. 10, 2005

(51) Int. Cl.
*H01L 29/76* (2006.01)
(52) U.S. Cl. .............. 257/401; 257/204; 257/288; 257/350; 257/E27.046
(58) Field of Classification Search .............. 257/204, 257/288, 350, 401, E27.046
See application file for complete search history.

(56) References Cited

U.S. PATENT DOCUMENTS

| | | | |
|---|---|---|---|
| 5,824,584 A * | 10/1998 | Chen et al. ............ | 438/267 |
| 5,940,699 A * | 8/1999 | Sumi et al. ............ | 438/233 |
| 6,100,145 A | 8/2000 | Kepler et al. | |
| 6,140,024 A | 10/2000 | Misium et al. | |
| 6,310,367 B1 | 10/2001 | Yagishita et al. | |
| 6,429,061 B1 | 8/2002 | Rim | |
| 2002/0022326 A1 * | 2/2002 | Kunikiyo ............ | 438/296 |
| 2004/0212003 A1 * | 10/2004 | Lojek ............ | 257/314 |

OTHER PUBLICATIONS

Ootsuka et al., "A Highly Dense, High-Performance 130 nm Node CMOS Technology For Large Scale System-On-A-Chip Applications", International Electron Devices Meeting 2000:IEDM Technical Digest, San Francisco, CA, Dec.10-13, 2000, pp. 575-578.
Tiwari et al., "Hole Mobility Improvement In Silicon-On-Insulator And Bulk Silicon Transistors Using Local Strain", International Electron Devices Meeting, 1997, Washington, DC, Dec. 7-10, 1997, pp. 939-941.

* cited by examiner

*Primary Examiner*—George Fourson
*Assistant Examiner*—Joannie Adelle Garcia
(74) *Attorney, Agent, or Firm*—Duane Morris LLP

(57) ABSTRACT

A structure to improve carrier mobility of a MOS device in an integrated circuit. The structure comprises a semiconductor substrate, containing a source region and a drain region; a conductive gate overlying a gate dielectric layer on the semiconductor substrate; a conformal stress film covering the source region, the drain region, and the conductive gate. In addition, the structure may comprise a semiconductor substrate, containing a source region and a drain region; a conductive gate overlying a gate dielectric layer on the semiconductor substrate; a plurality of stress films covering the source region, the drain region, and the conductive gate. Moreover, the structure may comprise a semiconductor substrate, containing a source region and a drain region; a conductive gate overlying a gate dielectric layer on the semiconductor substrate; a spacer disposed adjacent to the conductive gate, the spacer having a width less than 550 angstroms; a stress film covering the source region, the drain region, the conductive gate, and the spacer.

41 Claims, 4 Drawing Sheets

STRAINED SILICON MOS DEVICES

FIELD OF THE INVENTION

The present invention relates to MOS devices on integrated circuits, and more particularly to strained silicon MOS devices.

BACKGROUND

A conventional metal-oxide-semiconductor (MOS) transistor generally includes a semiconductor substrate, such as silicon, having a source, a drain, and a conductive gate. The conductive gate is typically located above a gate dielectric layer that is formed on the semiconductor substrate. The mobility of carriers in a channel region in the semiconductor substrate underneath the conductive gate determines the quality of MOS devices.

Generally, for a given electric field across the channel of an MOS device, the amount of current that flows through the channel is directly proportional to a mobility of carriers in the channel. Thus the higher the mobility of the carriers in the channel, the more current can flow and the faster a circuit can perform when using high mobility MOS transistors.

As the demand for faster devices continually grows in the industry, the desire for a device having an increased mobility also increases. Thus, a method for fabricating a device having an increased carrier mobility would be desirable.

SUMMARY OF THE INVENTION

A structure to improve carrier mobility of a MOS device in an integrated circuit. The structure comprises a semiconductor substrate, containing a source region and a drain region; a conductive gate overlying a gate dielectric layer on the semiconductor substrate; a conformal stress film covering the source region, the drain region, and the conductive gate. In addition, the structure may comprise a semiconductor substrate, containing a source region and a drain region; a conductive gate overlying a gate dielectric layer on the semiconductor substrate; a plurality of stress films covering the source region, the drain region, and the conductive gate. Moreover, the structure may comprise a semiconductor substrate, containing a source region and a drain region; a conductive gate overlying a gate dielectric layer on the semiconductor substrate; a spacer disposed adjacent to the conductive gate, the spacer having a width less than 550 angstroms; a stress film covering the source region, the drain region, the conductive gate, and the spacer.

BRIEF DESCRIPTION OF THE DRAWINGS

A more complete understanding of the present invention can be obtained by reference to the detailed description of embodiments in conjunction with the accompanying drawings, in which.

DETAILED DESCRIPTION

This description of the exemplary embodiments is intended to be read in connection with the accompanying drawings, which are to be considered part of the entire written description. In the description, the term "cover" should be constructed to include "fully cover" and "partially cover". Moreover, the term "cover" should be constructed to include "located directly on" and "located above."

Figure 1:
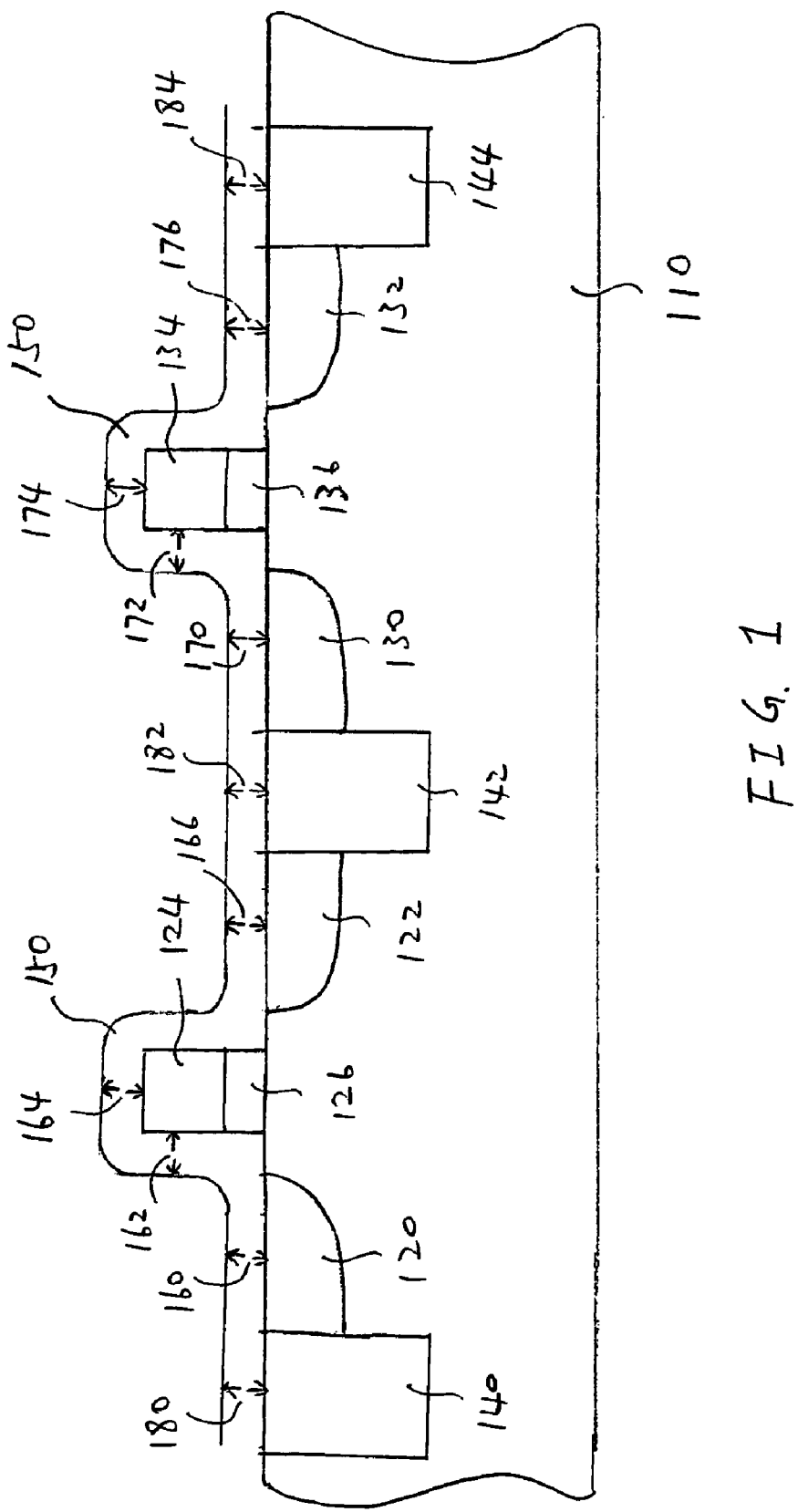
FIG. 1 illustrates an cross-sectional view of MOS devices with a conformal stress film.

As shown in FIG. 1, an exemplary embodiment of strained silicon MOS devices comprises a semiconductor substrate 110 containing source regions 120, 130, and drain regions 122, 132, conductive gates 124, 134 overlying a gate dielectric layer 126, 136, and a conformal stress film 150. The conformal stress film 150 covers the source regions 120, 130, drain regions 122, 132, and conductive gates 124, 134. The conformal stress film 150 can be a tensile stress film or a compressive stress film. This embodiment includes two MOS devices. The first MOS device has the source region 120, the drain region 122, and the conductive gate 164. A thickness of conformal stress film 150 is $T_{s1}$ 160 on the source region 120, $T_{d1}$ 166 on the drain region 122, and $T_{g1}$ 164 on the conductive gate 124. Likely, the second MOS device has the source region 130, the drain region 132, and the conductive gate 134. A thickness of conformal stress film 150 is $T_{S2}$ 170 on the source region 130, $T_{d2}$ 176 on the drain region 132, and $T_{g1}$ 174 on the conductive gate 134. The conformal stress film 150 is relatively uniform. A variance of thickness between $T_{S1}$, $T_{d1}$, and $T_{g1}$ is less than 150 angstroms. In addition, a variance of thickness between $T_{S1}$, $T_{S2}$, $T_{d1}$, $T_{d1}$, $T_{g1}$, and $T_{g1}$ is less than 150 angstroms although the first MOS and the second MOS may have different dimensions. In an alternative embodiment, an integrated circuit can comprise one MOS device or a plurality of MOS devices. In some other embodiments, spacers with a width less than 800 angstroms can be disposed adjacent to the conductive gates 124, 134.

The first and second MOS are separated from each other and from other components by passivation regions 140, 142, and 144. The passivation regions 140, 142, and 144 can be shallow trench isolation (STI) or field oxide comprising, for example, silicon dioxide. A thickness of conformal stress film 150 is $T_{p1}$ 180 on the passivatoin region 140, $T_{p2}$ 182 on the passivation region 142, and $T_{p3}$ 184 on the passivation region 144. A variance of thickness between $T_{p1}$, $T_{p2}$, and $T_{p3}$ is less than 150 angstroms. In another embodiment, a variance of thickness between passivation regions and active regions, that includes source regions, drain regions, and conductive gates, is less than 150 angstroms.

The conformal stress film 150 comprises silicon dioxide, silicon nitride, silicon oxynitride, silicon carbide, SiCN, or a combination thereof. The conformal stress film 150 can be formed by Rapid Thermal Chemical Vapor Deposition (RT-CVD), Atomic Layer Chemical Vapor Deposition (AL-CVD), Low Pressure Chemical Vapor Deposition (LP-CVD), or Plasma Enhanced Chemical Vapor Deposition (PE-CVD). The conformal stress film 150 can be a tensile stress film with a stress ranging approximately from 100 to 2000 M Pascals or a compressive stress film with a stress ranging approximately from −100 to −2000 M Pascals. The strength of conformal stress film 150 is determined by reaction parameters during a chemical vapor deposition process such as temperature, pressure, and flow rates of reacting gases. The tensile or compressive stress caused by the conformal stress film 150 affects the lattice structure of nearby semiconductor material to improve carrier mobility.

The conformal stress film 150 can be further doped with at least one material selected from a group comprising antimony, indium, silicon, arsenic, phosphorous, boron, argon, or oxygen. The doped conformal stress film is then annealed at least one time. The annealing process is to raise a temperature approximately from 350 to 700 Celsius degrees for less than 90 minutes. In addition, nitrogen gas is introduced in the annealing process.

In one embodiment, the conformal stress film 150 is a tensile stress film deposited by RT-CVD. During the deposition process, the temperature is about 750 Celsius degrees, the pressure is about 240 torrs, the flow rate of $SiH_4$ is about 50 sccm, the flow rate of $NH_3$ is about 5500 sccm, and the flow rate of $N_2$ is about 1500 sccm. After about 34 minutes, the conformal stress film 150 comprising silicon nitride with a thickness of 1000 angstroms is formed. The maximum variance of a thickness of conformal stress film 150 is 63 angstroms. The conformal stress film 150 has a tensile stress of 1.59 Giga Pascals. In an alternative embodiment, the thickness of conformal stress film 150 ranges approximately from 200 to 500 angstroms. The process temperature ranges approximately from 200 to 600 Celsius degrees. The uniformity of conformal stress film 150 is decided by reaction parameters such as temperature, pressure, flow rates of various gases in the process.

The MOS devices can be formed by conventional materials and methods known to people in the art. For example, the conductive gates 124, 134 can comprise polysilicon, metal, or SiGe with a thickness ranging approximately from 400 to 2000 angstroms. The gate dielectric layer 126, 136 can comprise silicon dioxide, hafnium oxide, silica, or zirconium oxide with a thickness ranging approximately from 8 to 50 angstroms.

Figure 2:
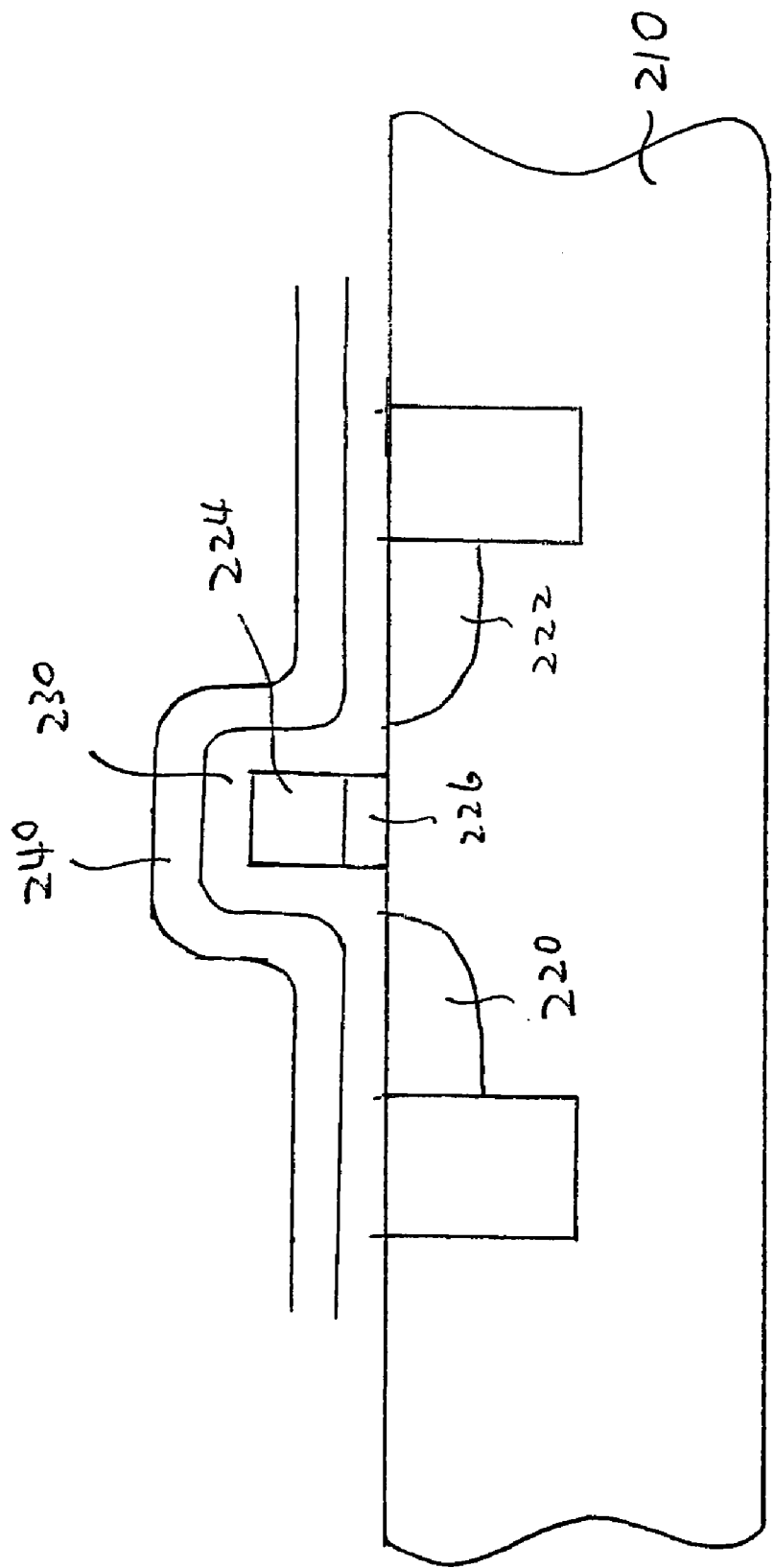
FIG. 2 illustrates a cross-sectional view of a MOS device with two stress films.

As shown in FIG. 2, another exemplary embodiment of strained silicon MOS devices comprises a substrate 210 containing a source region 220 and a drain regions 222, a conductive gate 224 overlying a gate dielectric layer 226, and two stress films containing an inner stress film 230 and an outer stress film 240. Stress films 230, 240 cover the source region 220, the drain region 222, and the conductive gate 224. The stress of inner stress film 230 may be less than the stress of outer film 240. In addition, the stress films 230 and 240 may comprise different materials and be formed by different methods. Because stress films 230 and 240 can be formed by methods mentioned in the above, the related description is omitted here.

Figure 3:
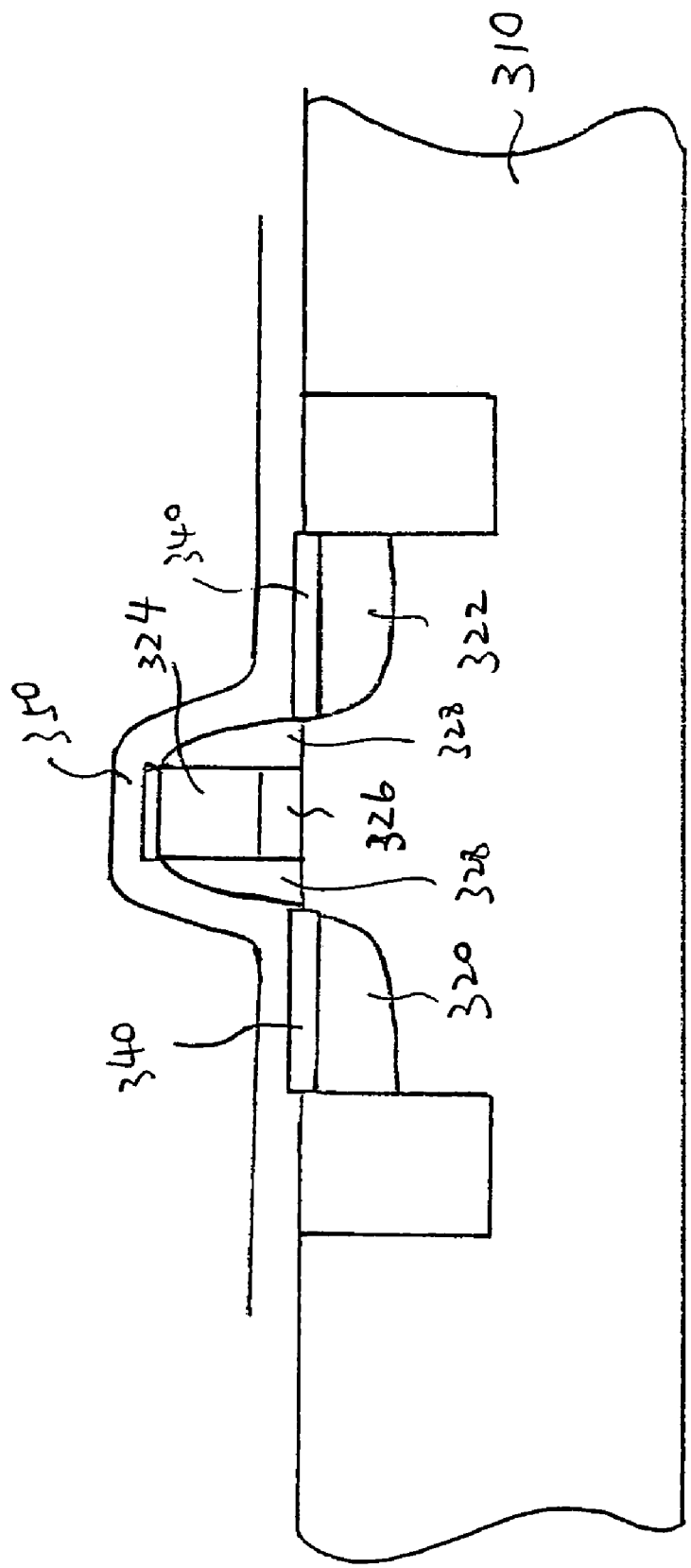
FIG. 3 illustrates a cross-sectional view of a MOS device as shown in FIG. 2 where an inner stress film covers source region and drain region.

FIG. 3 illustrates an alternative embodiment where two stress films cover a MOS device. The MOS device contains a substrate 310 with a source region 320 and a drain region 322, and a conductive gate 324 overlying a gate dielectric layer 326. The source region 320, the drain region 322, and the conductive gate 324 are collectively called an active region. An inner stress film 340 comprises nitrogenized salicide on the source region 320 and the drain region 322. The inner stress film may be inside the substrate 310 or on the top of the substrate. An outer stress film 350 with larger stress than that of the inner stress film 340 covers the inner stress film 340 and the conductive gate 324. In other words, the inner stress film 340 can only cover a portion of the active region. In some embodiments, spacers 328 are disposed adjacent to the conductive gate 324. A thin film of oxide liner with a thickness ranging approximately from 20 to 200 angstroms may be disposed between the conductive gate 324 and spacers 328.

The inner stress film 340 is formed by silicidation and nitrogenization. Materials such as Cobalt, or Nickel, may be used to silicidate the active region. A silicidation layer such as TiSi is formed in or on the substrate 310. Nitrogen plasma is then employed to form nitrogenized silicide film.

Figure 4:
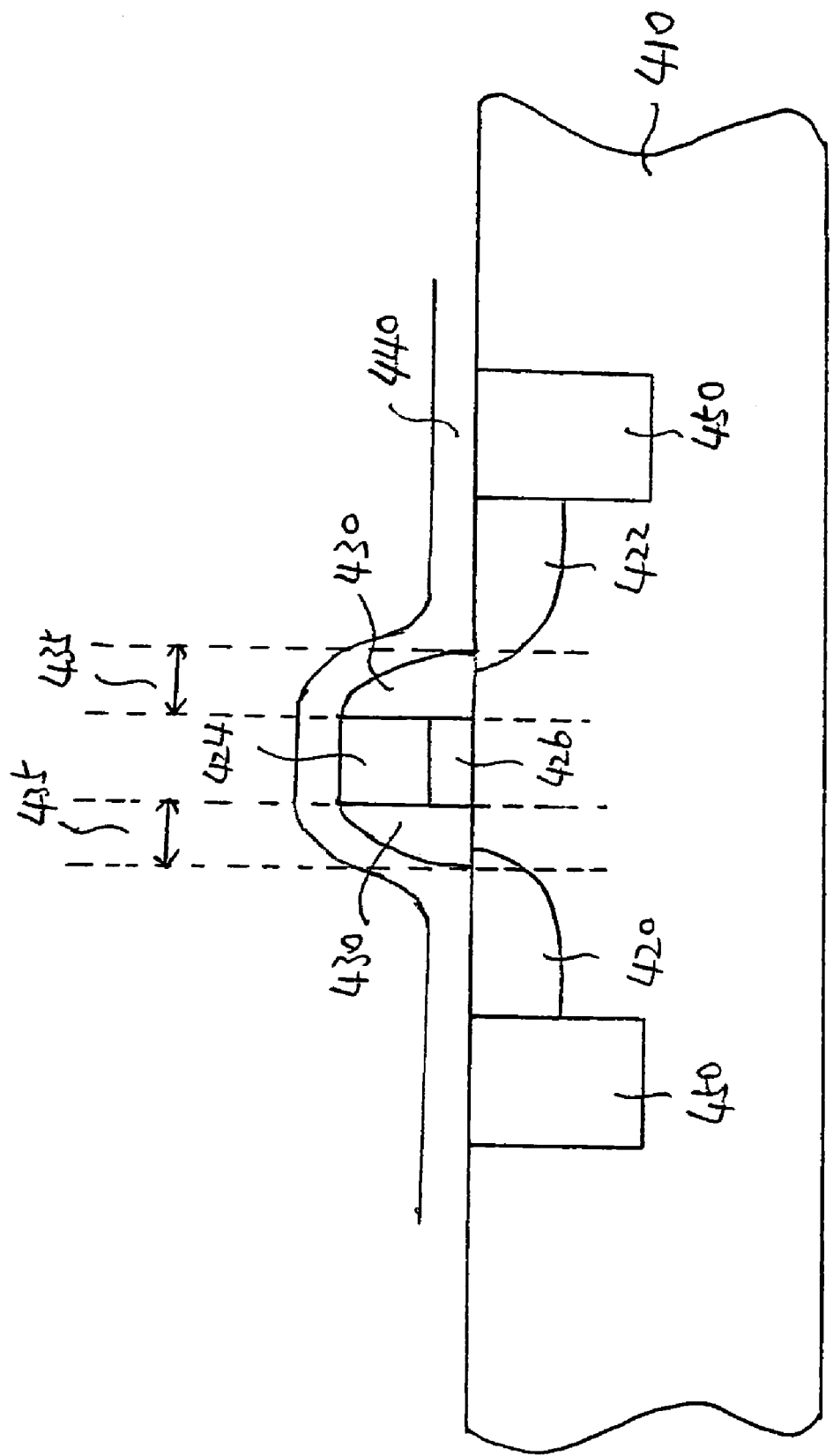
FIG. 4 illustrates a cross-sectional view of a MOS device with spacers adjacent to a conductive gate.

As shown in FIG. 4, an exemplary embodiment of a strained silicon MOS device comprises a substrate 410 containing a source region 420 and a drain region 422, a conductive gate 424 overlying a gate dielectric layer 426, and spacers 430 disposed adjacent to the conductive gate 426. The spacer 430 has a width 435 less than 550 angstroms. The width of a spacer is measured from the edge of a conductive gate to the edge of the spacer. A stress film 440 covers the source region 420, the drain region 422, the conductive gate 424, and the spacers 430. The spacer 430 can be of a round shape or L shape. A thin film of oxide liner with a thickness ranging approximately from 20 to 200 angstroms may be disposed between the conductive gate 424 and spacers 430. In this situation, the thickness of the oxide liner is included in the thickness of a spacer. The stress film 440 can be formed by methods mentioned above.

Although the invention has been described in terms of exemplary embodiments, it is not limited thereto. Rather, the appended claims should be construed broadly, to include other variants and embodiments of the invention, which may be made by those skilled in the art without departing from the scope and range of equivalents of the invention.

What is claimed is:

1. A structure to improve carrier mobility of a MOS device in an integrated circuit, comprising:
    a semiconductor substrate, containing a source region and a drain region;
    a conductive gate overlying a gate dielectric layer on said semiconductor substrate;
    at least one conformal stress film covering said source region, said drain region, and said conductive gate, wherein said stress film is a compressive stress film comprising silicon dioxide, silicon nitride, silicon oxynitride, silicon carbide, SICN, or a combination thereof and said stress film is doped with at least one material selected from a group consisting of antimony, Indium, silicon, arsenic, phosphorous, boron, argon, or oxygen.

2. The structure of claim 1 wherein a variance of a thickness of said conformal stress film on said source region, said drain region, and said conductive gate is less than 150 Angstroms.

3. The structure of claim 1 wherein said integrated circuit contains at least two MOS devices and said conformal stress film covers said source region, said drain region, and said conductive gate of each MOS device.

4. The structure of claim 3 wherein a variance of a thickness of said conformal stress film on said source regions, said drain regions, and said conductive gates is less than 150 Angstroms.

5. The structure of claim 3 further comprising a plurality of passivation regions adjacent to said source regions and said drain regions wherein a variance of a thickness of said conformal stress film on said passivation regions is less than 150 Angstroms.

6. The structure of claim 1 further comprising a spacer disposed adjacent to said conductive gate, said spacer having a width less than 800 angstroms.

7. The structure of claim 6 wherein a variance of a thickness of said conformal stress film on said source region, said drain region, said conductive gate, and said spacer is less than 150 Angatroms.

8. The structure of claim 1 wherein a stress of said stress film ranges approximately from −100 to −2000 M Pascals.

9. The structure of claim 1 wherein said stress film is annealed at least one time.

10. The structure of claim 9 wherein said stress film is annealed approximately from 350 to 700 Celsius degree.

11. The structure of claim 10 wherein said stress film is annealed for a period of time less than approximately 90 minutes.

12. The structure of claim 9 wherein said stress film is annealed when nitrogen is introduced.

13. The structure of claim 1 wherein a thickness of said stress film ranges approximatefy from 200 to 500 Angetroms.

14. The structure of claim 1 wherein said stress film is formed by RT-CVD, AL-CVD, LP-CVD, or PE-CVD.

15. The structure of claim 1 wherein said stress film is formed in a temperature ranging approximately from 200 to 600 C.

16. The structure of claim 1 wherein said conductive gate comprises polysilicon, metal, or SiGe.

17. The structure of claim 1 wherein a thickness of said conductive gate ranges approximately from 400 to 2000 Angatroms.

18. The structure of claim 1 wherein said gate dielectric layer comprises silicon dioxide, hafnium oxide, silica, or zirconium oxide.

19. The structure of claim 1 wherein a thickness of said gate dielectric layer ranges approximately from 8 to 50 Angstroms.

20. A structure to improve carrier mobility of a MOS device in an integrated circuit, comprising:
   a semiconductor substrate, containing a source region and a drain region;
   a conductive gate overlying a gate dielectric layer on said semiconductor substrate;
   a plurality of stress films covering said source region, said drain region, and said conductive gate, wherein an inner stress film of said plurality of stress films has a stress less than that of an outer stress film of said plurality of stress films wherein at least one of said plurality of stress films is a compressive stress film.

21. The structure of claim 20, wherein said inner stress film covers a portion of said source region, said drain region, and said conductive gate, and said outer stress film covers said inner stress film, said source region, said drain region, and said conductive gate.

22. The structure of claim 21, wherein said inner stress film comprises nitrogenized silicide.

23. The structure of claim 20 wherein a stress of said compressive stress film ranges approximately from −100 to −2000 M Pascals.

24. The structure of claim 20 wherein at least one of said plurality of stress films is a tensile stress film.

25. The structure of claim 24 wherein a stress of said tensile stress film ranges approximately from 100 to 2000 M Pascals.

26. The structure of claim 20 wherein said stress film comprises silicon dioxide, silicon nitride, silicon oxynitride, silicon carbide, SiCN, or a combination thereof.

27. The structure of claim 26 wherein said stress film is doped with at least one material selected from a group consisting of antimony, Indium, silicon, arsenic, phosphorous, boron, argon, or oxygen.

28. The structure of claim 27 wherein said stress film is annealed at least one time.

29. The structure of claim 28 wherein said stress film is annealed approximately from 350 to 700 Celsius degree.

30. The structure of claim 29 wherein said stress film is annealed for a period of time less than approximately 90 minutes.

31. The structure of claim 28 wherein said stress film is annealed when nitrogen is introduced.

32. The structure of claim 20 wherein a thickness or said stress film ranges approximately from 200 to 500 Angstroms.

33. The structure of claim 20 wherein said stress film is formed by RT-CVD, AL-CVD, LP-CVD, or PE-CVD.

34. The structure of claim 20 wherein said stress film is formed in a temperature ranging approximately from 200 to 600 C.

35. The structure of claim 20 wherein said conductive gate comprises polysilicon, metal, or SiGe.

36. The structure of claim 20 wherein a thickness of said conductive gate ranges approximately from 400 to 2000 Angstroms.

37. The structure of claim 20 wherein said gate dielectric layer comprises silicon dioxide, hafnium oxide, silica, or zirconium oxide.

38. The structure of claim 20 wherein a thickness of said gate dielectric layer ranges approximately from 8 to 50 Angstroms.

39. A structure to improve carrier mobility of a MOS devices in an integrated circuit, comprising:
   a semiconductor substrate, containing at least two MOS devices, each including a source region, a drain region and a conductive gate overlying a gate dielectric layer on said semiconductor substrate;
   at least one conformal stress film completely covering said source region, said drain region, and said conductive gate of each said MOS device,
   a plurality of passivation regions adjacent to said source regions and said drain regions,
   wherein a variance of a thickness of said conformal stress film on said passivation regions is less than 150 Angatroms,
   wherein said stress film is a compressive stress film.

40. The structure of claim 39 wherein said stress film comprises silicon dioxide, silicon nitride, silicon oxynitride, silicon carbide, SiCN, or a combination thereof.

41. The structure of claim 40 wherein said stress film is doped with at least one material selected from a group consisting of antimony, Indium, silicon, arsenic, phosphorous, boron, argon, or oxygen.

* * * * *

UNITED STATES PATENT AND TRADEMARK OFFICE
CERTIFICATE OF CORRECTION

PATENT NO.         : 7,342,289 B2  Page 1 of 1
APPLICATION NO. : 10/637351
DATED              : March 11, 2008
INVENTOR(S)      : Chien-Chao Huang et al.

It is certified that error appears in the above-identified patent and that said Letters Patent is hereby corrected as shown below:

Column 4, line 37, delete "SlCN" and insert -- SiCN- -- therefor.

Column 4, line 65, delete "Angatroms" and insert -- Angstroms -- therefor.

Column 5, line 11, delete "approximatefy" and insert -- approximately -- therefor.

Column 5, lines 11-12, delete "Angetroms" and insert -- Angstroms -- therefor.

Column 5, line 22, delete "Angatroms" and insert -- Angstroms -- therefor.

Column 6, lines 45-46, delete "Angatroms," and insert -- Angstroms, -- therefor.

Signed and Sealed this

Seventeenth Day of June, 2008

JON W. DUDAS
*Director of the United States Patent and Trademark Office*